United States Patent
Sikka et al.

(10) Patent No.: US 11,139,269 B2
(45) Date of Patent: Oct. 5, 2021

(54) MIXED UNDER BUMP METALLURGY (UBM) INTERCONNECT BRIDGE STRUCTURE

(71) Applicant: INTERNATIONAL BUSINESS MACHINES CORPORATION, Armonk, NY (US)

(72) Inventors: Kamal K. Sikka, Poughkeepsie, NY (US); Paul S. Andry, Yorktown Heights, NY (US); Yang Liu, Yorktown Heights, NY (US); Pascale Gagnon, Brigham (CA); Christian Bergeron, Granby (CA); Maryse Cournoyer, Granby (CA)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/752,642

(22) Filed: Jan. 25, 2020

(65) Prior Publication Data

US 2021/0233892 A1    Jul. 29, 2021

(51) Int. Cl.
*H01L 25/065* (2006.01)
*H01L 23/31* (2006.01)
(Continued)

(52) U.S. Cl.
CPC ...... *H01L 25/0655* (2013.01); *H01L 23/3157* (2013.01); *H01L 23/42* (2013.01);
(Continued)

(58) Field of Classification Search
CPC .................................................. H01L 25/0655
See application file for complete search history.

(56) References Cited

U.S. PATENT DOCUMENTS 8,866,308 B2   10/2014   Roy et al.
9,059,179 B2    6/2015   Karikalan et al.
(Continued)

OTHER PUBLICATIONS

Anonymous, "Mixed UBM Plating"; IP.com No. IPCOM000255175D; Electronic Publication Date: Sep. 6, 2018; 3 pgs.
(Continued)

*Primary Examiner* — William A Harriston
(74) *Attorney, Agent, or Firm* — Intelletek Law Group, PLLC; Gabriel Daniel, Esq.

(57) ABSTRACT

An electronic package and a method of manufacture includes a substrate having an upper surface with a trench formed in a bridge region. First pads are arranged on the upper surface of the substrate, outside of the bridge region, and a bridge is positioned in the trench. A plurality of second pads are arranged on an upper surface of the bridge. A plurality of pillars are electrically coupled to the plurality of second pads. Two or more semiconductor chips are positioned in a side-by-side proximal arrangement overlaying the bridge and the substrate. A first semiconductor chip is joined to the bridge, then a second semiconductor chip is joined to the bridge, followed by attaching the chip-bridge assembly to the substrate with the bridge positioned within the substrate trench. Each of the two or more semiconductor chips have first electrical connections including bumps, and second electrical connections including third pads.

20 Claims, 23 Drawing Sheets

(51) Int. Cl.
*H01L 23/42* (2006.01)
*H01L 23/538* (2006.01)
*H01L 25/00* (2006.01)
*H01L 23/00* (2006.01)

(52) U.S. Cl.
CPC ...... *H01L 23/5381* (2013.01); *H01L 23/5386* (2013.01); *H01L 24/06* (2013.01); *H01L 24/16* (2013.01); *H01L 24/81* (2013.01); *H01L 25/50* (2013.01); *H01L 2224/0401* (2013.01); *H01L 2224/0603* (2013.01); *H01L 2224/06132* (2013.01); *H01L 2224/16227* (2013.01); *H01L 2224/81986* (2013.01)

(56) References Cited

U.S. PATENT DOCUMENTS

| | | |
|---|---|---|
| 9,799,618 B1 | 10/2017 | Arvin et al. |
| 2008/0138932 A1 | 6/2008 | Hatano et al. |
| 2015/0364422 A1 | 12/2015 | Zhai et al. |
| 2016/0093597 A1 | 3/2016 | Chang et al. |
| 2017/0092573 A1 | 3/2017 | Manusharow et al. |
| 2018/0102336 A1 | 4/2018 | Arvin et al. |
| 2018/0337129 A1 | 11/2018 | Li et al. |
| 2019/0164806 A1* | 5/2019 | Leobandung ....... H01L 23/5385 |
| 2019/0295952 A1 | 9/2019 | Sikka et al. |

OTHER PUBLICATIONS

Mahajan, R. et al., "Embedded Multi-Die Interconnect Bridge (EMIB)—A High Density, High Bandwidth Packaging Interconnect"; IEEE 66th Electronic Components and Technology Conference (2016); 9 pgs.

* cited by examiner

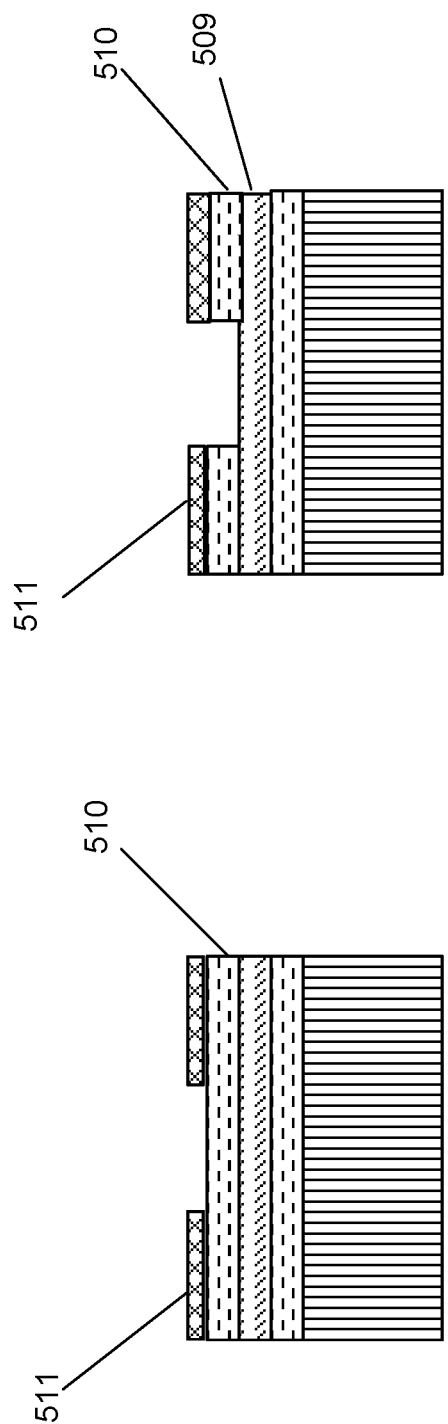

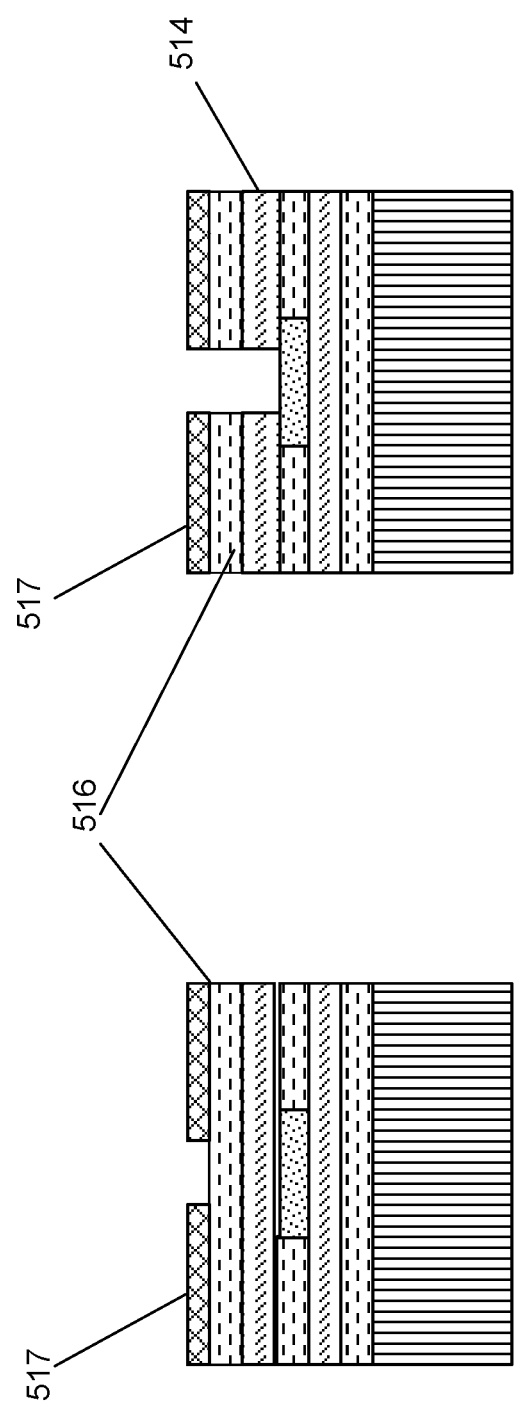

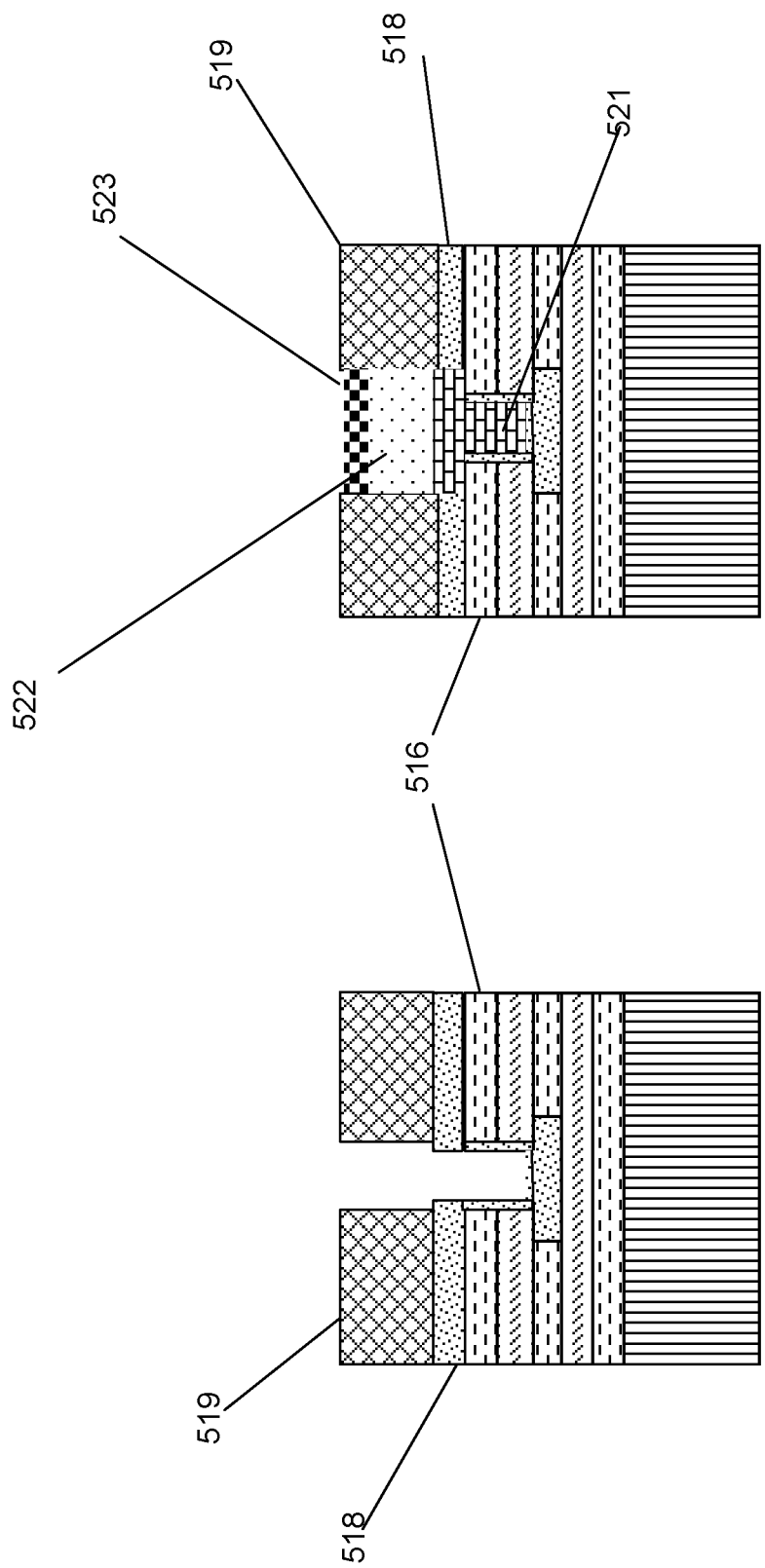

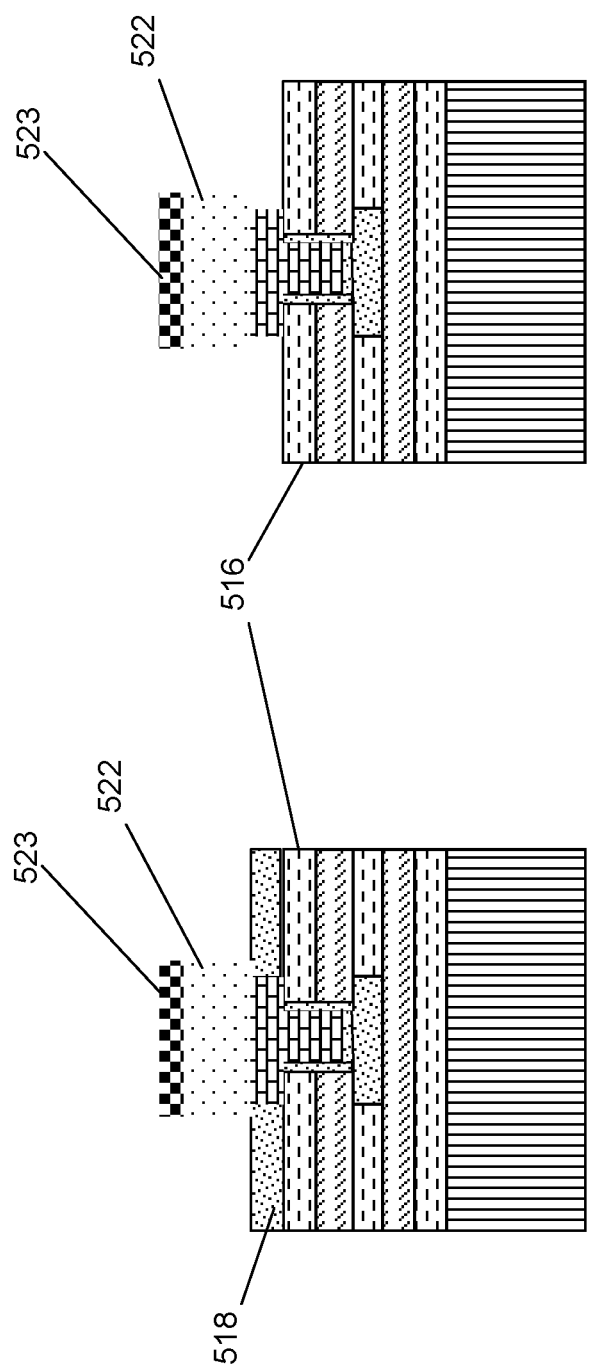

MIXED UNDER BUMP METALLURGY (UBM) INTERCONNECT BRIDGE STRUCTURE

BACKGROUND

Technical Field

The present disclosure generally relates to fabrication structures and methods for semiconductor devices. More particularly, the present disclosure relates to under bump metallurgy (UBM) for direct bonded heterogeneous integration (DBHi) interconnect bridge semiconductor chip packaging structures and methods of manufacturing the same.

Description of the Related Art

Chip packaging structures are part of a manufacturing process that provides electrical and photonic connections for signal input and output, power input, voltage control, thermal dissipation, and structural robustness. A mixed pitch/size UBM for a DBHi structure includes under bumps having varying pitches and sized UBMs.

SUMMARY

According to various embodiments, an electronic package includes a substrate having an upper surface with a trench formed in respective bridge regions and a plurality of first pads arranged on the upper surface of the substrate outside of the respective bridge regions. A bridge is positioned in the trench in the substrate. A plurality of second pads is arranged on an upper surface of the bridge. A plurality of pillars having respective first ends is coupled to the plurality of second pads on the bridge. Two or more semiconductor chips in a side-by-side proximal arrangement overlay the bridge and the substrate. The two or more semiconductor chips have respective first electrical connections with bumps configured to correspond to and electrically couple with the plurality of first pads arranged on the upper surface of the substrate outside of the respective bridge regions. The two or more semiconductor chips also have respective second electrical connections with third pads configured to be electrically coupled with respective second ends of the plurality of pillars.

In an embodiment, the electronic package is a direct bonded heterogeneous integration (DBHi) structure.

In an embodiment, the bumps on the two or more semiconductor chips are formed by an under bump metallurgy (UBM) having a mixed pitch or size.

In an embodiment, the bumps on the two or more semiconductor chips are a different size than the pillars on the bridge.

In an embodiment, the bumps include a controlled collapse chip connection (C4).

In an embodiment, the electronic package further includes a lid and a thermal interface material overlaying the two or more chips.

In an embodiment, an underfill material is arranged between the two or more semiconductor chips and the substrate.

In an embodiment, the bridge positioned in the trench in the substrate includes a chip.

In an embodiment, the bridge positioned in the trench in the substrate includes a memory chip, and the at least two chips overlaying the substrate include a microprocessor chip and a power supply chip, respectively.

In an embodiment, the electronic package includes I/O pads electrically coupled to a lower surface of the substrate.

According to an embodiment, a method of forming an electronic package includes the operations of arranging a plurality of first pads on the upper surface of the substrate outside of the respective bridge regions. A bridge is positioned in a trench of laminate substrate. A plurality of second pads are arranged on an upper surface of the bridge. A plurality of pillars are electrically coupled at respective first ends to the plurality of second pads arranged on the bridge. Two or more semiconductor chips are joined to the plurality of pillars on the bridge prior to joining the two or more semiconductor chips to the plurality of first pads on the substrate. The joining of the two or more semiconductor chips to the plurality of pillars on the bridge prior to joining the two or more semiconductor chips to the plurality of first pads on the substrate includes positioning the two semiconductor chips in a side-by-side proximal arrangement overlaying the bridge and the substrate. The two or more semiconductor chips have respective first electrical connections with bumps configured to correspond to and electrically couple with the first plurality of pads arranged on the upper surface of the substrate outside of the respective bridge regions, and respective second electrical connections with pads configured to correspond to and electrically couple with respective second ends of the plurality of pillars.

According to an embodiment, an assembly process sequence for an electronic package according to a solder hierarchy includes determining a solder reflow temperature for a plurality of components of an electronic structure including a laminate substrate, a bridge and a chip in which the bridge is arranged in a trench in the laminate substrate, and a semiconductor chip is attached to the bridge and to the laminate substrate. Upon determining a first highest solder reflow temperature and a second highest reflow temperature of the plurality of components, attaching a first component having the first highest solder reflow temperature to a second component having the second highest solder reflow temperature; and attaching the first component and the second component to a third component, wherein the first component is the bridge, the second component is the semiconductor chip, and the third component is the laminate substrate.

These and other features will become apparent from the following detailed description of illustrative embodiments thereof, which is to be read in connection with the accompanying drawings.

BRIEF DESCRIPTION OF THE DRAWINGS

The drawings are of illustrative embodiments. They do not illustrate all embodiments. Other embodiments may be used in addition or instead. Details that may be apparent or unnecessary may be omitted to save space or for more effective illustration. Some embodiments may be practiced with additional components or steps and/or without all the components or steps that are illustrated. When the same numeral appears in different drawings, it refers to the same or like components or steps.

FIGS. 4A-4S illustrate operations of a wafer fabrication process flow for forming bumps on a substrate outside of a bridge region, consistent with an illustrative embodiment, in which:

FIG. 4A illustrates an Si substrate of an electronic package, consistent with an illustrative embodiment;

FIG. 4S illustrates the substrate after stripping the PR from the dry film lithography operation, consistent with an illustrative embodiment.

FIGS. 5A-5Q illustrate different stages of a process flow for creating pillars on a bridge, consistent with an illustrative embodiment, in which FIG. 5A illustrates an Si substrate of a bridge, consistent with an illustrative embodiment;

FIG. 5C illustrates a first lithography operation in which a photoresist (PR) layer is applied to part of a top layer of the $SiO_2$, consistent with an illustrative embodiment;

FIG. 5D illustrates the bridge substrate after a reactive etching ion (ME) operation to remove a portion of the top $SiO_2$, consistent with an illustrative embodiment;

FIG. 5I illustrates a second lithography operation in which a PR layer is applied to a portion of the top $SiO_2$ layer of the bridge substrate, consistent with an illustrative embodiment;

FIG. 5J illustrates the bridge substrate after a reactive etching ion (RIE) operation to remove a portion of the top $SiO_2$, consistent with an illustrative embodiment;

FIG. 5M illustrates the substrate after application of a PR layer in a lithography operation, consistent with an illustrative embodiment;

FIG. 5N illustrates the bridge substrate after performing a plating operation, consistent with an illustrative embodiment;

FIG. 5O illustrates the bridge substrate after stripping the PR layer, consistent with an illustrative embodiment;

FIG. 5P illustrates the bridge substrate after a seed etching operation to remove a portion of the sputtered layers of Ti, Cu and Ti shown in FIG. 5L, consistent with an illustrative embodiment; and FIG. 5Q illustrates the bridge substrate after a reflow operation to form a pillar, consistent with an illustrative embodiment.

DETAILED DESCRIPTION

Overview

In the following detailed description, numerous specific details are set forth by way of examples to provide a thorough understanding of the relevant teachings. However, it should be understood that the present teachings may be practiced without such details. In other instances, well-known methods, procedures, components, and/or circuitry have been described at a relatively high-level, without detail, to avoid unnecessarily obscuring aspects of the present teachings.

In the present disclosure, the term "under bump metallurgy" (UBM), as used herein, generally refers to stacks that provide an electrical connection from an integrated circuit (IC) chip (e.g., a die) to a solder bump. A controlled collapse chip connection (C4) package is a type of semiconductor chip package that can include an IC chip having a number of round solder bumps that are attached to a top surface of the IC chip. UBM stacks may include one or more stacked metallization layers, and a mixed UBM has more than one size or pitch to carry electrical current between the semiconductor and a substrate (e.g. a printed circuit board).

In the present disclosure, direct bonded heterogeneous integration (DBHi) packaging structures are discussed. The term "heterogeneous integration," as used herein, generally refers to the assembly and packaging of separately manufactured components onto a single package. In DBHi (DBHi is specific to joining silicon chips with bridges directly to each other), the packaging of various types of components having different functionalities, process technologies and nodes. The combined devices can vary by type (e.g., packages or bare chips), and by functionality (e.g., sensors, cache, processors, signal processors, photonics, RF, and MEMS).

Example Architecture

Figure 1:
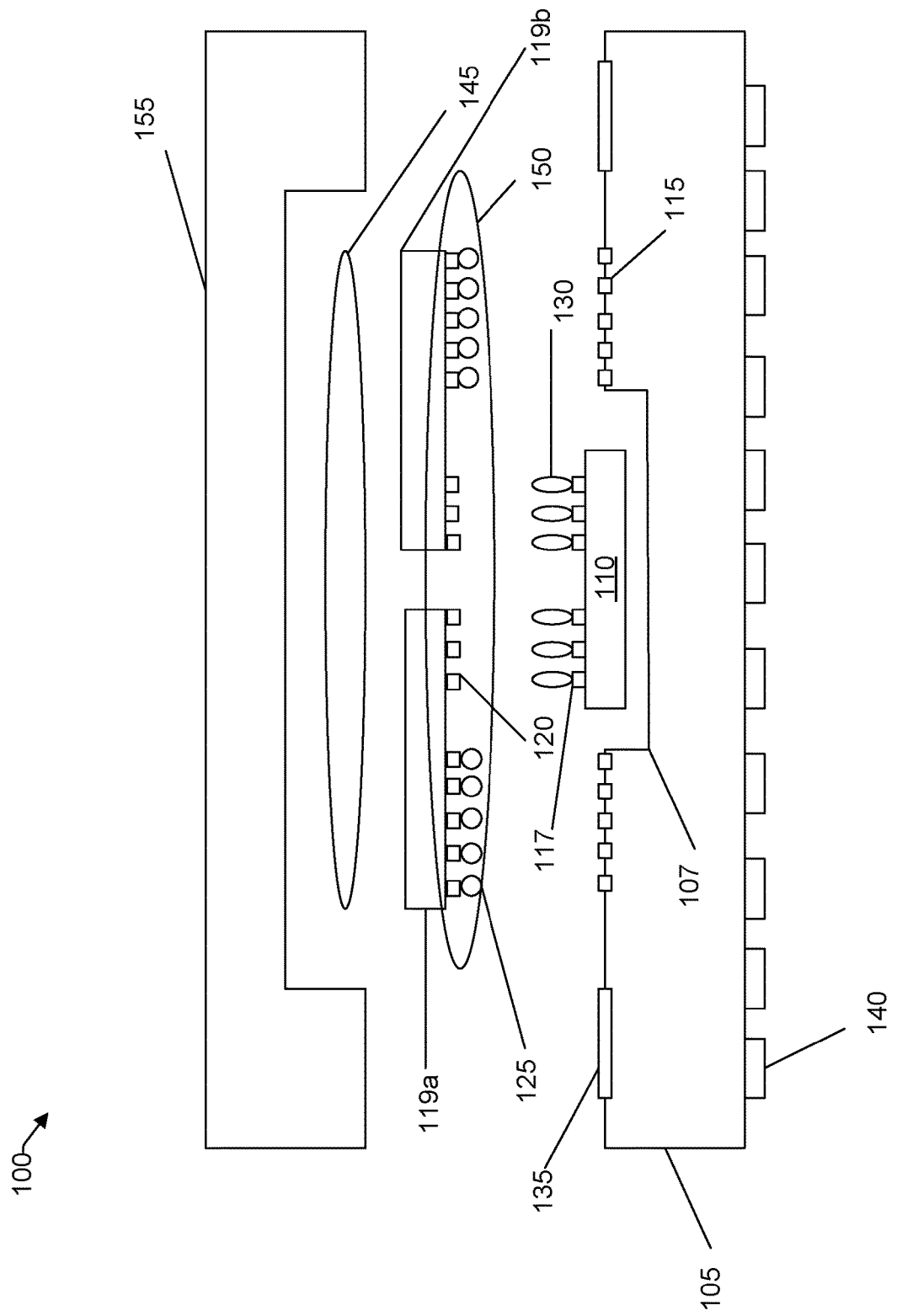
FIG. 1 illustrates example architecture of an electronic package structure in a partially exploded view, consistent with an illustrative embodiment.

FIG. 1 illustrates an example architecture of an electronic package 100 in a partially exploded view, consistent with an illustrative embodiment. A substrate 105 has an upper surface in which a trench 107 is formed. The substrate 105 in an embodiment is a laminate substrate 105, but the present disclosure is not so limited. The trench 107 can be formed in respective bridge regions of an upper surface of the substrate 105.

A bridge 110 is disposed in the trench 107, and the arrangement is referred to as a bridge region. Two semiconductor chips 119a, 119b are shown in a side-by-side proximal arrangement overlaying the bridge 110 and the substrate 105. Although in the present illustrative embodiment, a single trench 107 in which a bridge 110 is disposed is shown, it will be understood that the substrate 105 may have a plurality of trenches 107 formed therein, each of which may have a respective bridge, and form respective bridge regions.

On the upper surface of the substrate 105 there is arranged a plurality of first pads 115 outside of the bridge region formed by trench 107 and bridge 110. FIG. 1 shows the first pads 115 positioned substantially to the left and the right of the trench 107, however the present disclosure is not limited to such an arrangement.

With continued reference to FIG. 1, the bridge 110 is shown having a plurality of second pads 117 arranged on a surface and having a respective pillar 130 with a first end electrically coupled to one of the second pads 117.

The two semiconductor chips 119a, 119b are typically constructed of silicon and are joined by the bridge 110, which may also be constructed of silicon. A direct solder connection of the two semiconductor chips 119a, 119b to the pillars on the bridge 100 is performed prior to joining the two semiconductor chips 119a, 119b to the substrate 105. According to this aspect of the present disclosure, the two semiconductor chips 119a, 119b initially float on the bridge 100 via the pillars 130 and then the two semiconductor chips are connected to the substrate 105 by bumps 125 that adhere to the first pads 115 on the substrate 105. The pillars 130 are shown as being arranged in two groups in this illustrative embodiment, with each group of pillars 130 configured to be electrically coupled to third pads 120 on the two semiconductor chips 119a, 119b.

The two semiconductor chips 119a, 119b overlay a portion of the bridge region and a portion outside the bridge region of the substrate 105. For example, the two semiconductor chips 119a, 119b each have respective first electrical connections with third pads 120 and bumps 125 corresponding to and electrically coupled with the plurality of first pads 115 arranged on the upper surface of the substrate outside of the bridge region. In addition, the two semiconductor chips 119a, 119b have respective second electrical connections with only the third pads 120 (e.g. no bumps on a portion of the two semiconductor chips 119a, 119b that attached to the pillars 130 on the bridge 110). The third pads 120 correspond to and are electrically coupled with respective second ends of the plurality of pillars 130, with the pillars 130 having been attached at first ends to the bridge 110. In an aspect of the present disclosure, by separating the bumps 125 on the respective semiconductor chips 119a, 119b, and the pillars 130 on the bridge 110, this arrangement of the bumps 125 and pillars 130 provide for a less complicated and less expensive structure (and method of manufacture) than mixing different sized bumps and pillars on the same semiconductor chips.

A lid attach 135 is arranged at peripheral areas of the upper surface of the substrate 105. The lid attach can be an adhesive that adheres lid 155 to the upper surface of the substrate 105.

I/O pads 140 are electrically connected to a lower surface of the substrate 105 to facilitate routing of an I/O system of the electronic package with, for example, an application board, other components, interfaces, etc.

A thermal insulating material (TIM) 145 may be arranged between an upper surface of the two semiconductor chips 119a, 119b and the lid 155. In addition, an underfill material 150 is shown between the two semiconductor chips 119a, 119b and the substrate 105.

In the present illustrative embodiment, the bridge 107 may be embodied as an integrated circuit (e.g., chip). For example, the two semiconductor chips 119a, 119b overlaying the substrate 105 may be a microprocessor chip and a power supply chip, respectively. However, the present disclosure is not limited in this regard.

Figure 2:
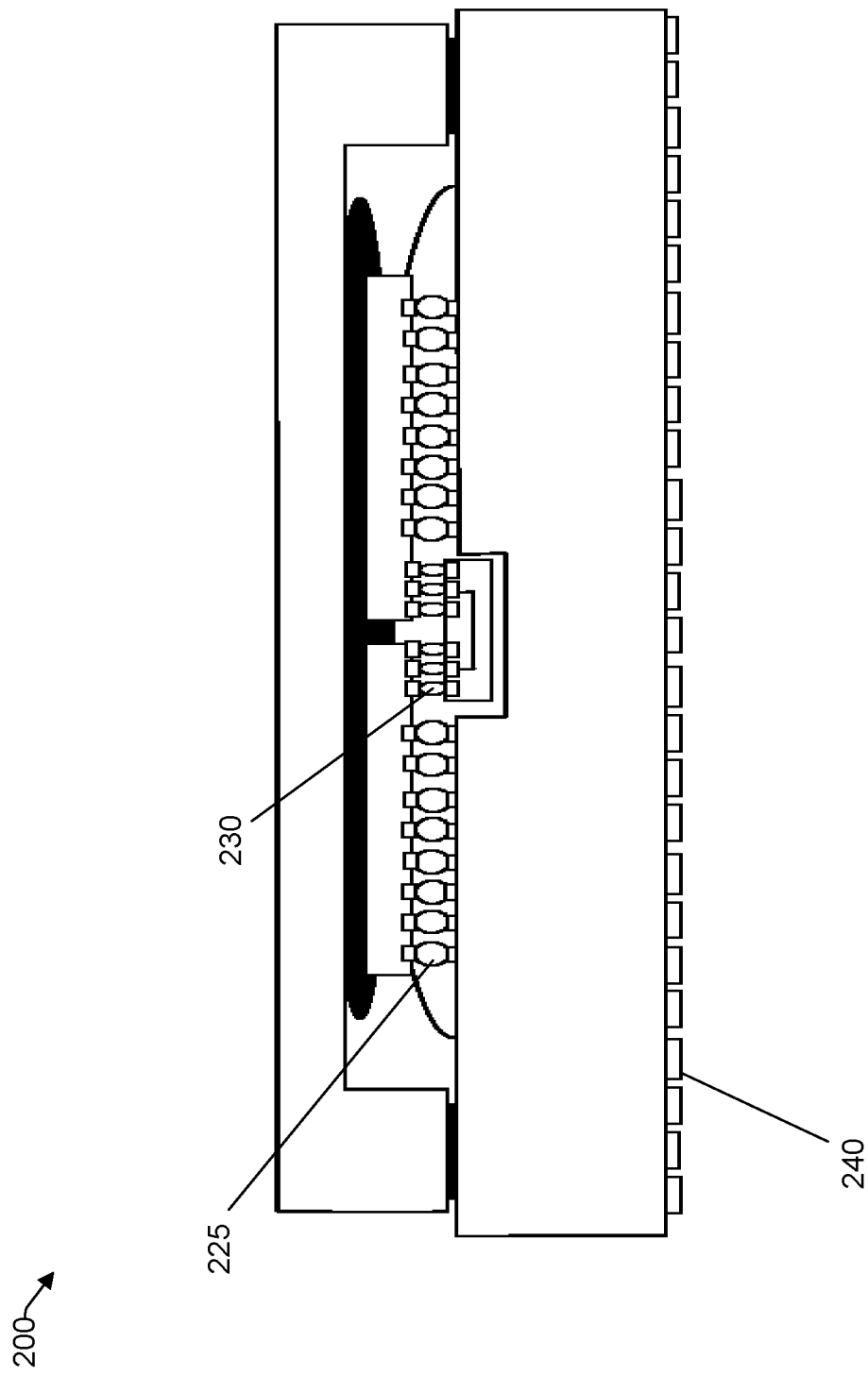
FIG. 2 is an illustration of an electronic package structure in which the bumps are larger than the pillars, consistent with an illustrative embodiment.

FIG. 2 is an illustration of an interconnect bridge structure, consistent with an illustrative embodiment. In FIG. 2, the interconnect bridge structure 200 shows that the bumps 225 are larger than the pillars 230, whereas in FIG. 1, the pillars 130 are larger than the bumps 125. The I/O pads 240 are shown at the lower surface of a substrate for further connection to other electronic components, such as a circuit board.

Example Processes

Figure 3:
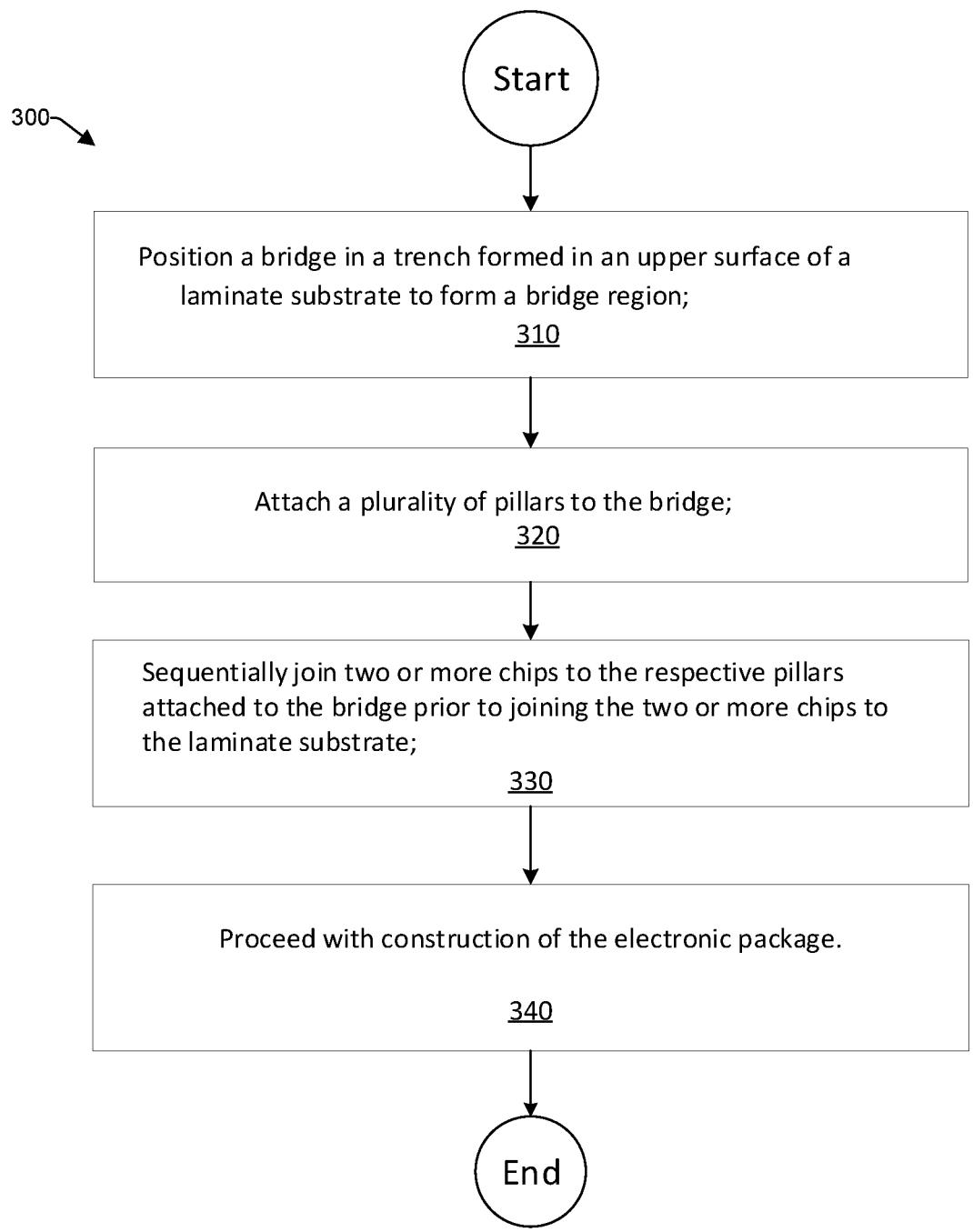
FIG. 3 is a flowchart of a method of forming an electronic package, consistent with an illustrative embodiment.

With the foregoing overview of the example architecture 100, it may be helpful now to consider a high-level discussion of example processes. To that end, FIG. 3 is illustrative of a method of forming an electronic package, consistent with an example embodiment. For discussion purposes, the process is described with reference to the architecture 100 of FIG. 1.

Flowchart 300 illustrates operations associated with forming an electronic package. At operation 310, the positioning of a bridge 110 in a trench 107 formed in an upper surface of a substrate 105 (e.g. a laminate substrate) is performed. A bridge region is formed.

At operation 320, a plurality of pillars are attached to the bridge. In one embodiment, the mixed bumps (of a different size and/or pitch) are separated to facilitate a faster and more efficient construction by arranging the pillars 130 on the bridge 110 and the bumps 125 on the two semiconductor chips 119a, 119b in an area away from the bridge because of the difficulty in forming pillars and bumps of different sizes on a same component in a conventional UBM construction.

At operation 330, the two or more semiconductor chips 119a, 119b are joined to the pillars 130 that are attached to the bridge. The two or more semiconductor chips 119a, 119b are floating on the bridge after this operation is performed. The pillars 130 can be formed of various types of metals that may include but are not limited to Copper (Cu) or an alloy of Cu.

At operation 340, the two or more semiconductor chips are then attached to the substrate 105 along a periphery of the bridge region by the bumps 125 to the first pads 115. In this embodiment, while some of the operations may be performed in a different order than shown and described, it will be understood that operation 330 is performed prior to operation 340. Thus, the two or more semiconductor chips 119a, 119b are attached to the bridge 110 prior to the two or more chips 119a, 119b being attached to the substrate. The construction of the electronic package may then proceed in a desired manner after the successive operations of 330 and 340.

Figure 4B:
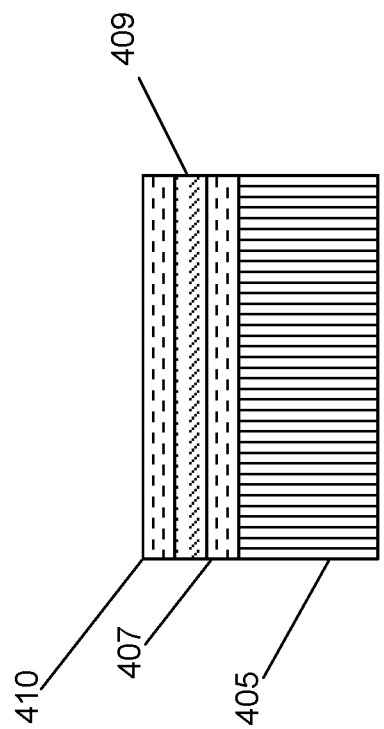
FIG. 4B illustrates forming $SiO_2$, SiN, $SiO_2$ layers on the Si substrate, consistent with an illustrative embodiment.
Figure 4A:
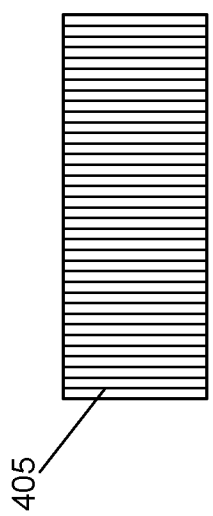
Figure 4D:
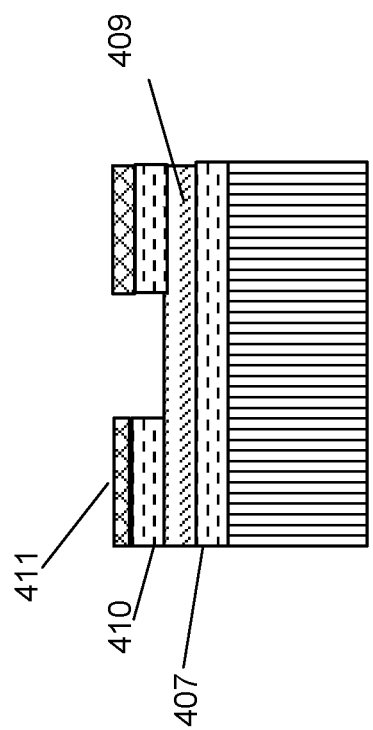
FIG. 4D illustrates the substrate after a reactive etching ion (ME) operation to remove a portion of the top $SiO_2$, consistent with an illustrative embodiment.
Figure 4C:
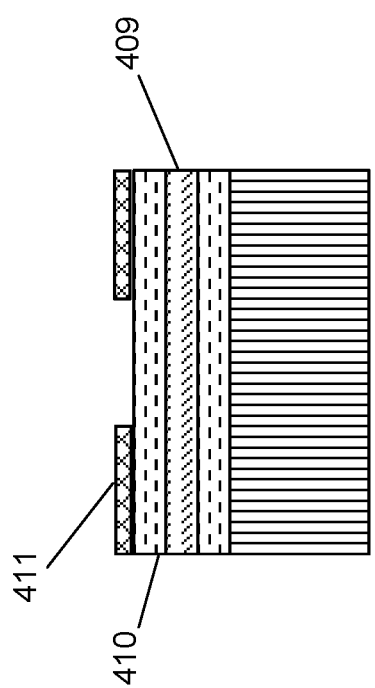
FIG. 4C illustrates a first lithography operation in which a photoresist (PR) layer is applied to part of a top layer of the $SiO_2$, consistent with an illustrative embodiment.
Figure 4F:
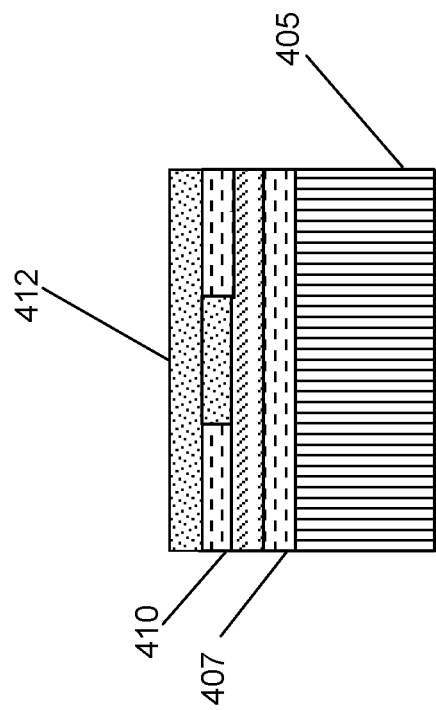
FIG. 4F illustrates a substrate after a sputter and plate operation is performed on the upper layer of the substrate, consistent with an illustrative embodiment.
Figure 4E:
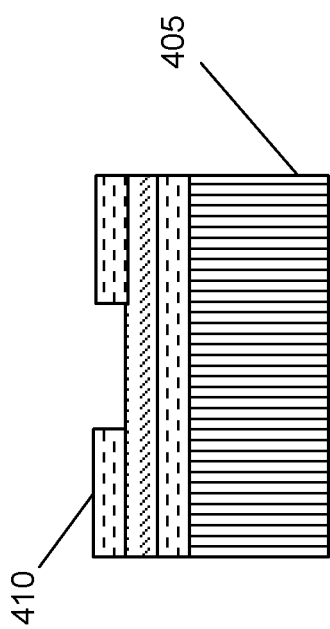
FIG. 4E illustrates the substrate after stripping the PR layer, consistent with an illustrative embodiment.
Figure 4H:
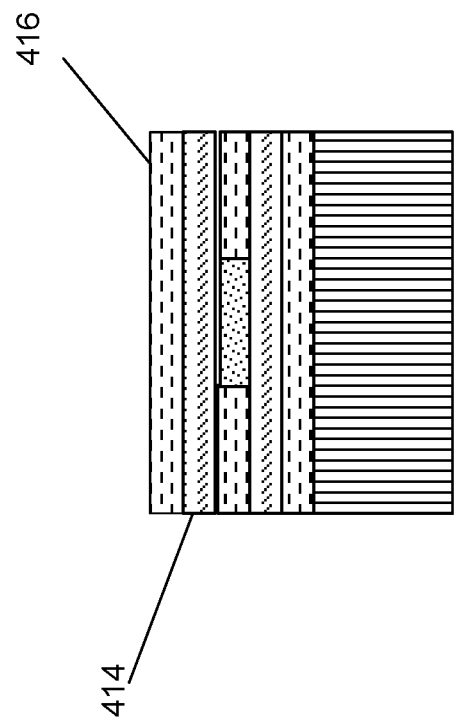
FIG. 4H illustrates the substrate after applying successive layers of SiN and $SiO_2$, consistent with an illustrative embodiment.
Figure 4G:
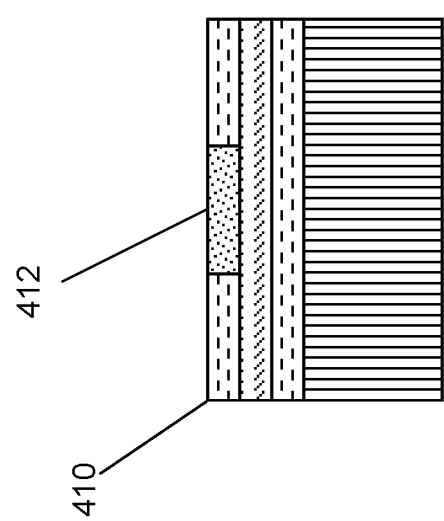
FIG. 4G illustrates the substrate after performing a chemical mechanical planarization (CMP) operation on the material used in the sputter and plate operation, consistent with an illustrative embodiment.
Figure 4J:
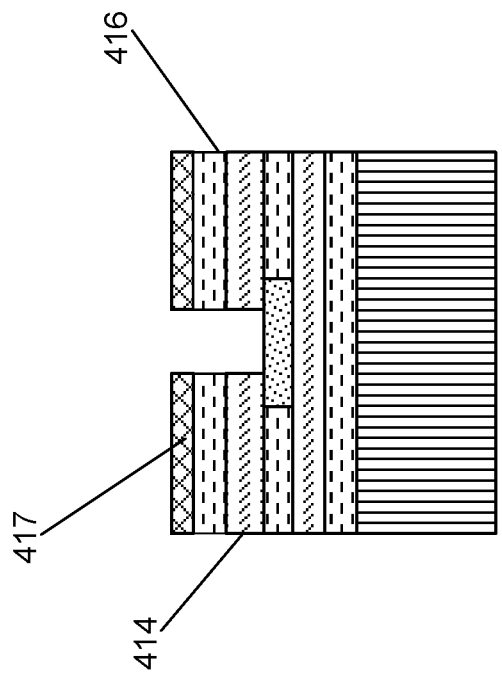
FIG. 4J illustrates the substrate after a reactive etching ion (RIE) operation to remove a portion of the top $SiO_2$, consistent with an illustrative embodiment.
Figure 4I:
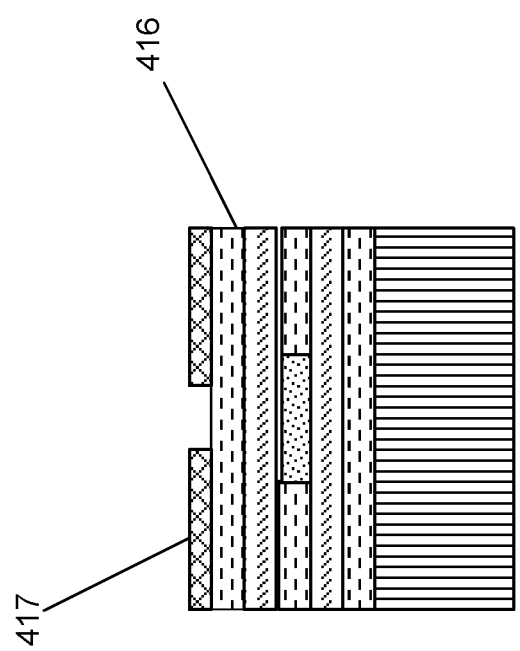
FIG. 4I illustrates a second lithography operation in which a PR layer is applied to a portion of the top $SiO_2$ layer of the substrate, consistent with an illustrative embodiment.
Figure 4L:
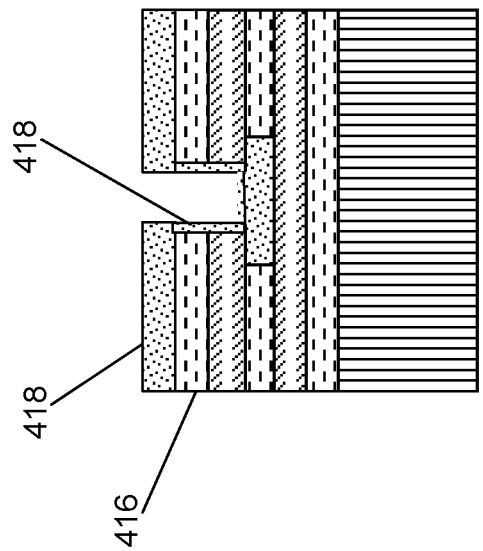
FIG. 4L illustrates a sputter operation on the substrate of successive layers of Ti, Cu, and Ti, consistent with an illustrative embodiment.
Figure 4K:
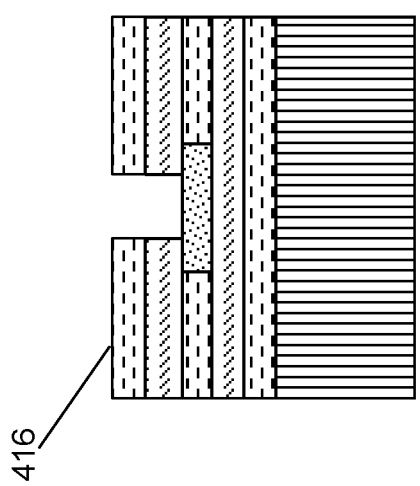
FIG. 4K illustrates the substrate after the stripping the PR of the second lithography operation, consistent with an illustrative embodiment.
Figure 4N:
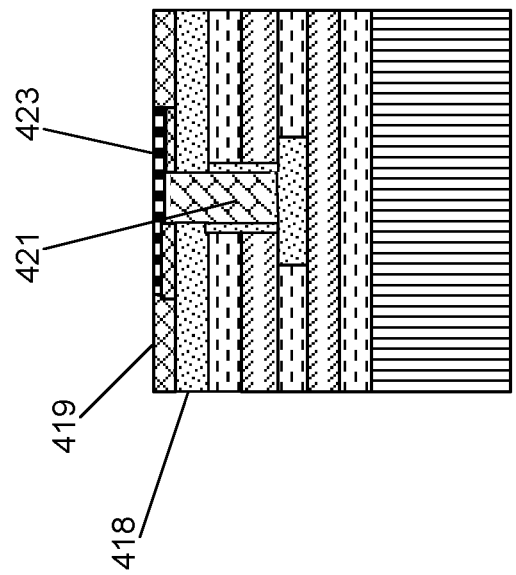
FIG. 4N illustrates application of a plating layer to the substrate, consistent with an illustrative embodiment.
Figure 4M:
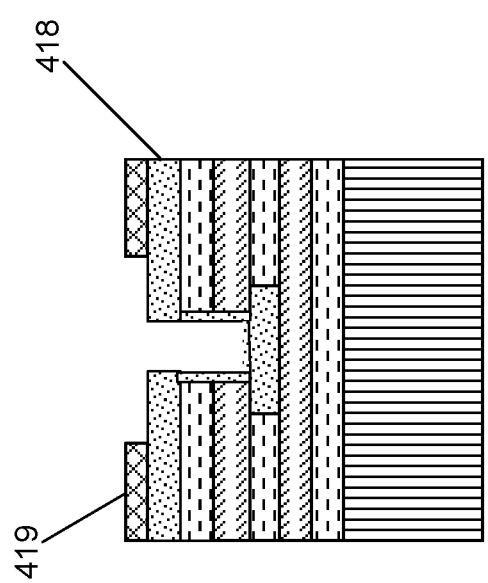
FIG. 4M illustrates a third lithography operation in which a PR layer is applied to a top portion of the sputtered Ti, Cu, Ti layers shown in FIG. 4L, consistent with an illustrative embodiment.
Figure 4P:
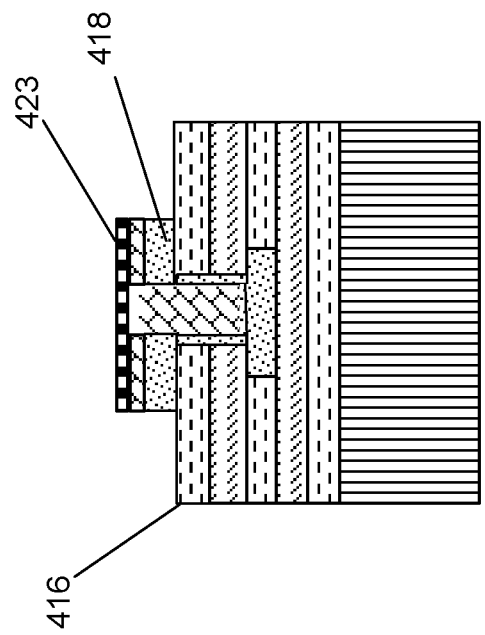
FIG. 4P illustrates the substrate after a seed etching operation to remove a portion of the sputtered Ti, Cu Ti layers, consistent with an illustrative embodiment.
Figure 4O:
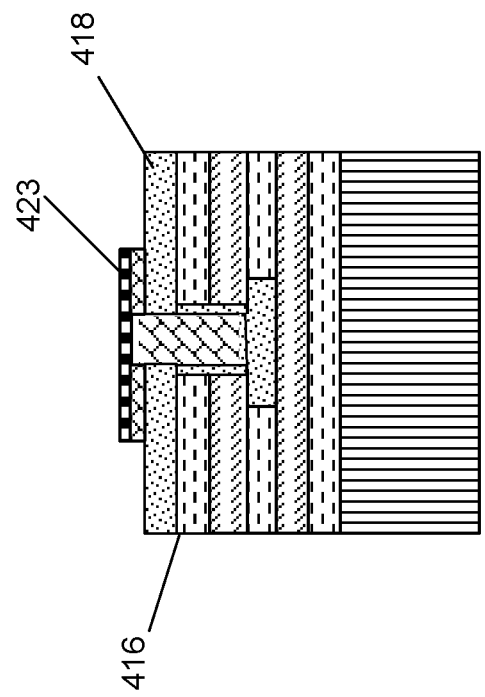
FIG. 4O illustrates the substrate after stripping the PR layer from the third lithography operation shown in FIG. 4M, consistent with an illustrative embodiment.
Figure 4R:
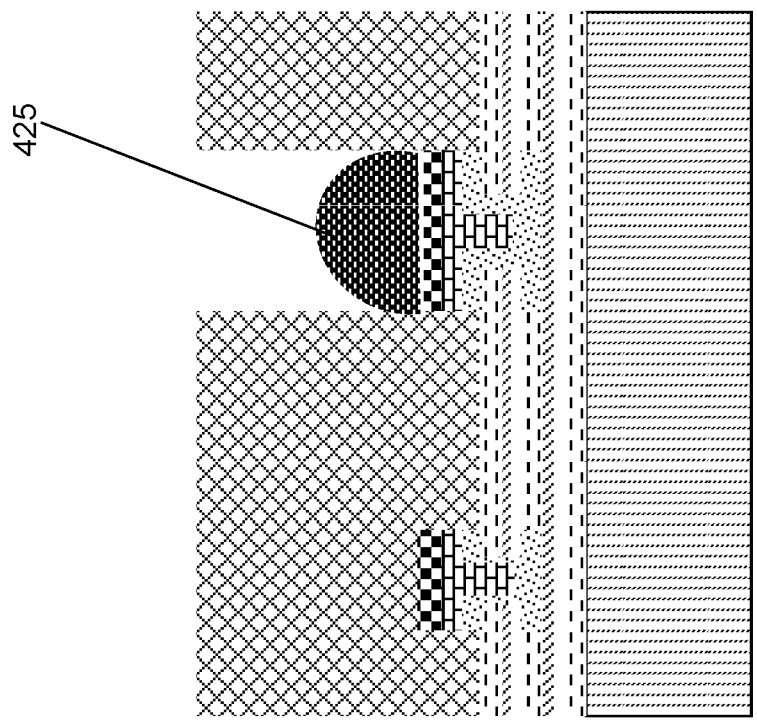
FIG. 4R illustrates the substrate after application of a plate or injection molded solder to form a bump, consistent with an illustrative embodiment.
Figure 4Q:
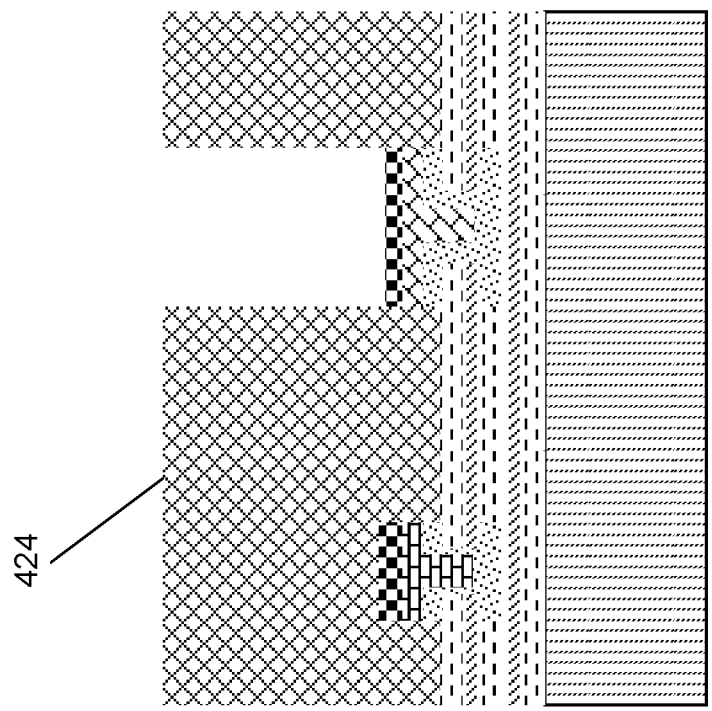
FIG. 4Q illustrates the substrate after application of PR in a dry film lithography operation, consistent with an illustrative embodiment.
Figure 4S:
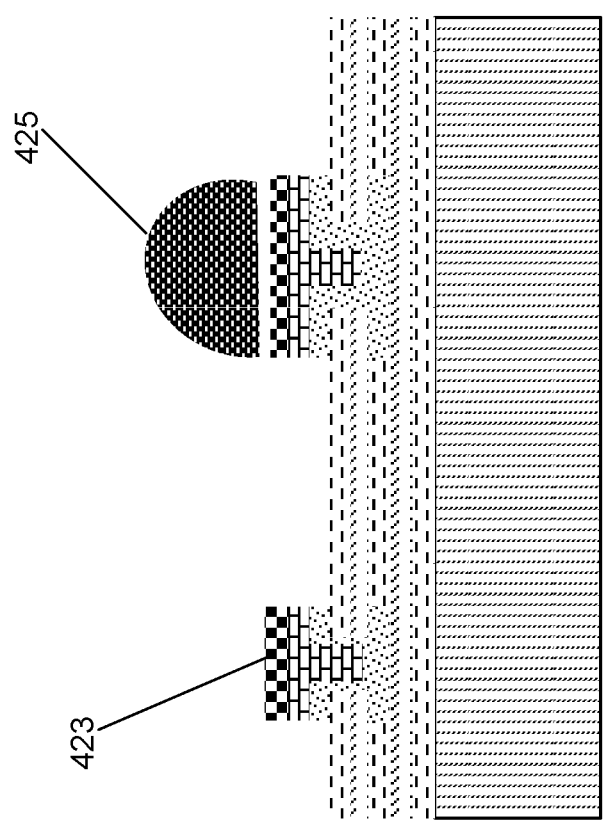

FIG. 4A-4S illustrate operations of a wafer fabrication process flow of forming bumps on a substrate outside of a bridge region consistent with an illustrative embodiment consistent with an illustrative embodiment. A person of ordinary skill in the art should understand that the operations shown and described in FIGS. 4A-4S are provided for explanatory purposes, and the present disclosure is not limited to the illustrative embodiment shown and described.

FIG. 4A shows a substrate 405 that is made of silicon (Si). It is to be understood that the composition of the substrate 405 is not limited to Si.

In FIG. 4B are plurality of layers are formed on the substrate 405. In this illustrative embodiment, SiO$_2$ layer 407, SiN layer 409, and SiO$_2$ layer 410 are formed on top of the Si substrate 405.

FIG. 4C illustrates a first lithography operation in which a photoresist (PR) layer 411 is applied to part of the SiO$_2$ layer 410 to create a pattern on the substrate 405. FIG. 4D illustrates the substrate 405 after a reactive etching ion (RIE) operation to remove a portion of the SiO$_2$ layer 410.

FIG. 4E illustrates the substrate 405 after stripping the PR layer 411 that was previously applied to part of the SiO$_2$ layer 410. Next as shown in FIG. 4F, a sputter and plate operation is performed on the substrate 405 to apply layer 412. Layer 412 may be, for example, a metal such as Ti, Cu, etc.

FIG. 4G illustrates the substrate 405 after performing a chemical mechanical planarization (CMP) operation on the layer 412 applied in the sputter and plate operation. At this stage of construction, FIG. 4G shows a center portion of layer 412 remaining after the CMP operation, and SiO$_2$ layer 410 is adjacent layer 412.

FIG. 4H illustrates the substrate 405 after applying additional layers of SiN 414 and SiO$_2$ 416. As shown in FIG. 4I, a second lithography operation is performed in which a PR layer 417 is applied to a portion of the top SiO$_2$ layer 416 of the substrate 405.

FIG. 4J illustrates the substrate 405 after another reactive etching ion (RIE) operation is performed to remove a portion of the SiN 414 and SiO$_2$ 416 layers. As shown in FIG. 4K, the substrate 405 is shown after stripping the PR layer 417 applied in the second lithography operation.

FIG. 4L illustrates a sputter operation on the substrate of layer 418. In this illustrative embodiment, successive applications of Ti, Cu, and Ti form layer 418. However, the present disclosure is not limited to such construction.

FIG. 4M illustrates a third lithography operation in which a PR layer 419 is applied to a top portion of the layer 418. FIG. 4N illustrates application of plating layers 421, 423 to the substrate 405.

FIG. 4O illustrates the substrate 405 after stripping the PR 419 layer applied during the third lithography operation shown in FIG. 4M. FIG. 4P illustrates the substrate 405 after a seed etching operation to remove a portion of the sputtered layer 418.

FIG. 4Q illustrates the substrate 405 after application of PR layer 424 in a dry film lithography operation. Next, FIG. 4R illustrates the substrate 405 after application of a plate or injection molded solder to form a bump 425. FIG. 4S illustrates the substrate after stripping the PR layer 424 applied during the dry film lithography operation. On plating layer 423, a pad or another bump could have been applied during the fabrication process.

Figure 5B:
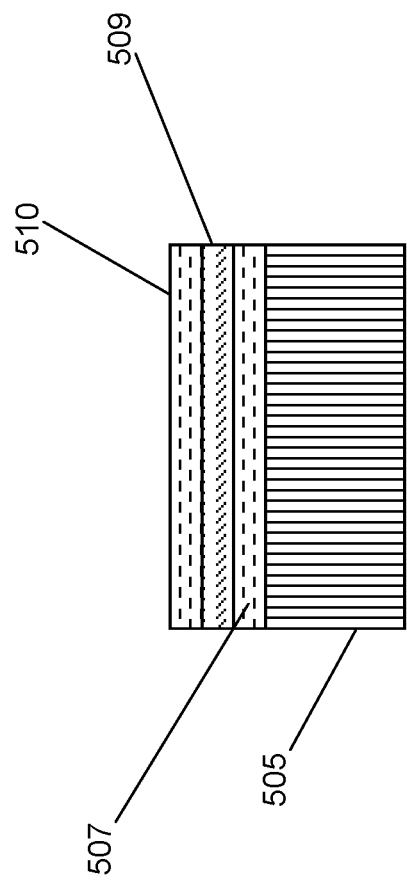
FIG. 5B illustrates forming $SiO_2$, SiN, $SiO_2$ layers on the bridge substrate, consistent with an illustrative embodiment.
Figure 5A:
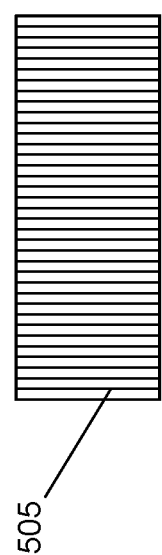
Figure 5F:
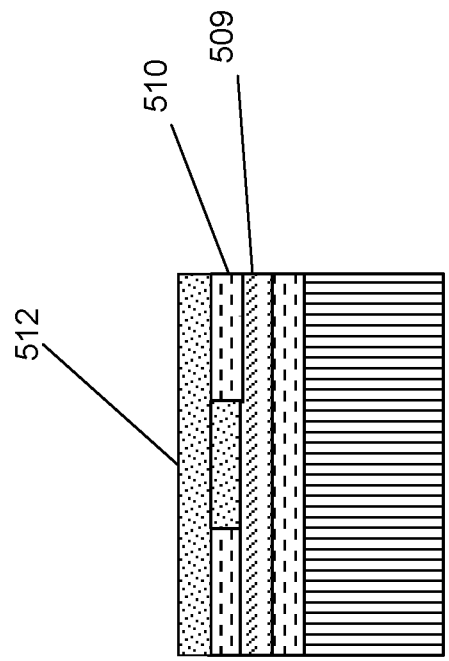
FIG. 5F illustrates the bridge substrate after a sputter and plate operation is performed on the upper layer of the substrate, consistent with an illustrative embodiment.
Figure 5E:
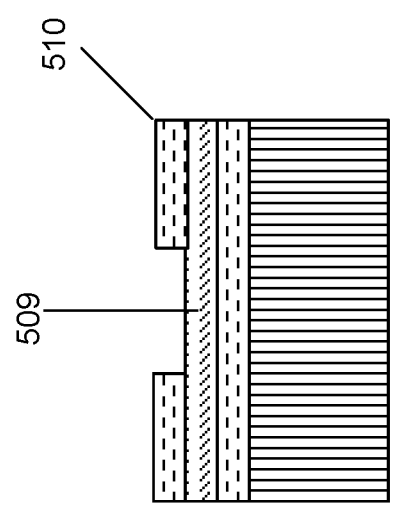
FIG. 5E illustrates the bridge substrate after stripping the PR layer, consistent with an illustrative embodiment.
Figure 5H:
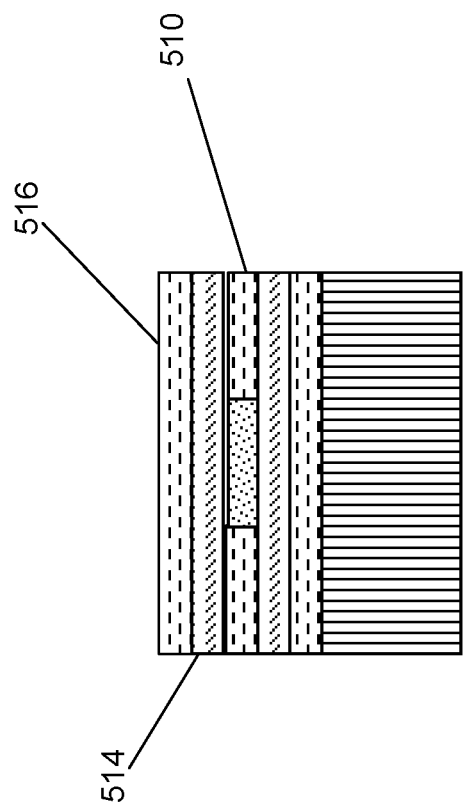
FIG. 5H illustrates the bridge substrate after applying successive layers of SiN and $SiO_2$, consistent with an illustrative embodiment.
Figure 5G:
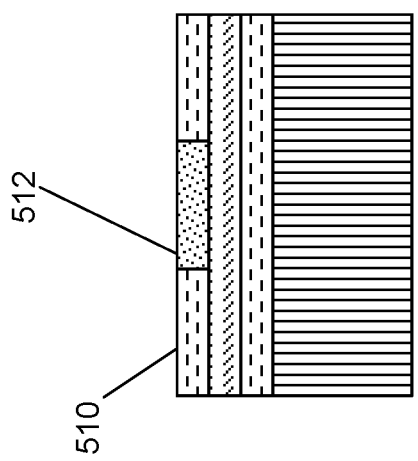
FIG. 5G illustrates the bridge substrate after performing a chemical mechanical planarization (CMP) operation on the material used in the sputter and plate operation, consistent with an illustrative embodiment.
Figure 5L:
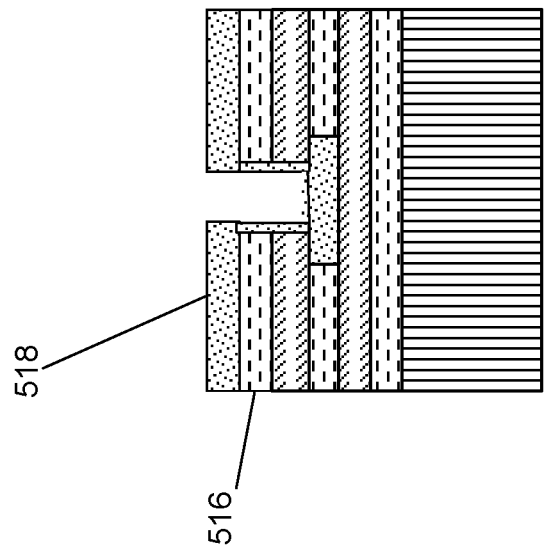
FIG. 5L illustrates a sputter operation on the bridge substrate of successive layers of Ti, Cu, and Ti, consistent with an illustrative embodiment.
Figure 5K:
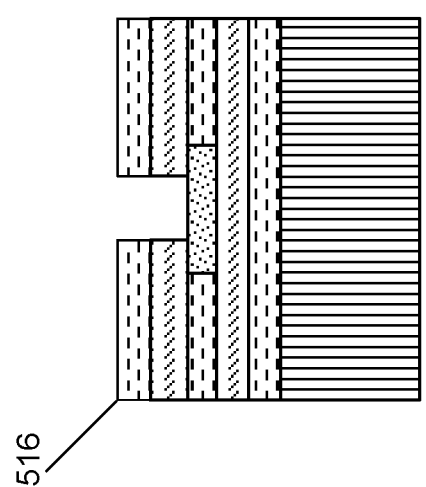
FIG. 5K illustrates the bridge substrate after the stripping the PR of the second lithography operation, consistent with an illustrative embodiment.
Figure 5Q:
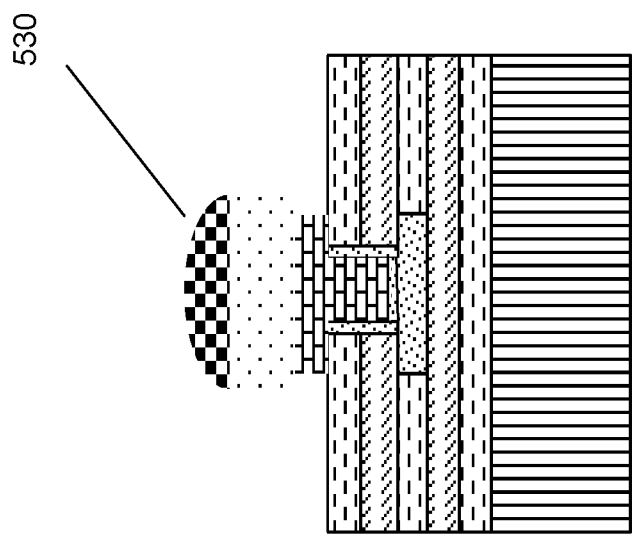

FIG. 5A-5Q illustrate a fabrication process flow creating pillars on a bridge, consistent with an illustrative embodiment. FIG. 5A illustrates an Si substrate 505 of a bridge consistent with an illustrative embodiment. It is to be understood that a material other than Si may be used for substrate 505. In this example, the substrate 405 is referred to as a bridge substrate 505.

FIG. 5B shows the bridge substrate 505 having successive layers of a first SiO$_2$ layer 507, an SiN layer 509, and second SiO$_2$ layer 510 formed thereon. Then as shown in FIG. 5C, a first lithography operation is performed in which a photoresist (PR) layer 511 is applied to part of the second SiO$_2$ layer 510.

FIG. 5D illustrates the bridge substrate 505 after a reactive etching ion (RIE) operation to remove a portion of the second SiO$_2$ layer 510. Subsequently, as shown in FIG. 5E, the PR layer 511 is stripped from the bridge substrate 505.

FIG. 5F illustrates the bridge substrate 505 after a sputter and plate operation is performed to apply a layer 512. Layer 512 can be, for example, Cu, or can be successive applications of Ti and Cu. The present disclosure is not limited with regard to the material described for use in layer 512.

FIG. 5G illustrates the bridge substrate after performing a chemical mechanical planarization (CMP) operation on the material used in the sputter and plate operation. An upper portion of layer 512 is removed, leaving a portion of layer 512 as an upper surface that is adjacent strips of the second SiO$_2$ layer 510.

FIG. 5H illustrates the bridge substrate 505 after applying successive layers of SiN 514 and SiO$_2$ layer 516 consistent with an illustrative embodiment. Subsequently, FIG. 5I illustrates a second lithography operation in which a PR layer 517 is applied to a portion of the SiO$_2$ layer 516 of the bridge substrate 505.

FIG. 5J illustrates the bridge substrate after a reactive etching ion (RIE) operation to remove a portion of the SiN layer 514 and SiO$_2$ layer 516. Next, FIG. 5K illustrates the bridge substrate 505 after the stripping the PR layer 517 of the second lithography operation.

FIG. 5L illustrates a sputter operation on the bridge substrate 505 in which a layer 518 is formed of successive applications of Ti, Cu, and Ti. It will be understood that other materials may be used to form layer 518.

FIG. 5M illustrates the bridge substrate 505 after application of a PR layer 519 in a lithography operation consistent with an illustrative embodiment. The lithography operation may be, for example, a dry film lithography operation.

FIG. 5N illustrates the bridge substrate 505 after performing a plating operation, consistent with an illustrative embodiment. Layers 521, 522 and 523 are shown.

FIG. 5O illustrates the bridge substrate 505 after stripping the PR layer 519. Next, FIG. 5P illustrates the bridge substrate 505 after a seed etching operation to remove a portion of the sputtered layer 518.

FIG. 5Q illustrates the bridge substrate 505 after a reflow operation to form a pillar 530. While only a single pillar 530 is shown, it is to be understood that multiple pillars can be created at the same time using the process shown and described.

Figure 6:
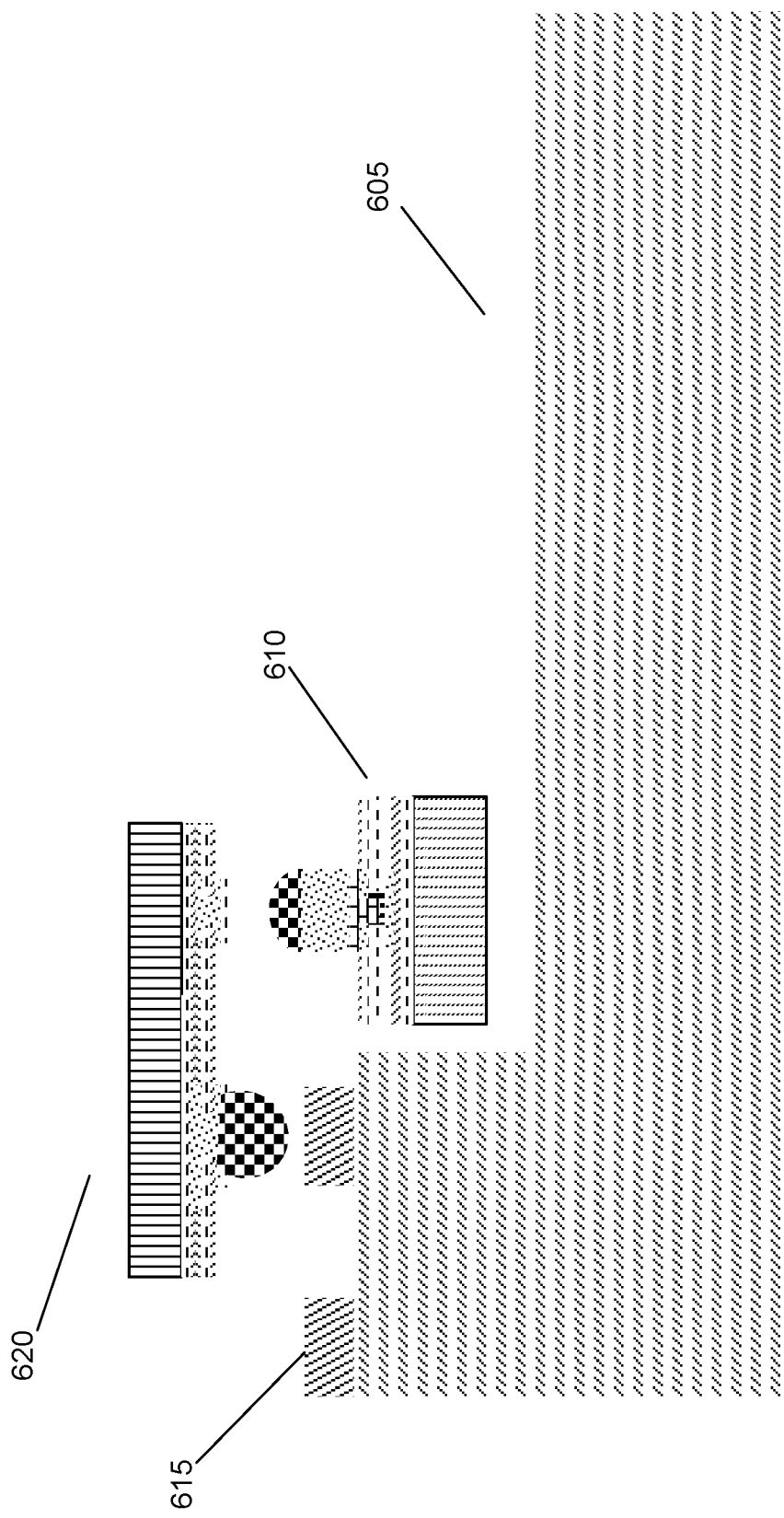
FIG. 6 illustrates a process of creating an electronic package using a solder hierarchy, consistent with an illustrative embodiment.

FIG. 6 illustrates an electronic package created using a solder hierarchy, consistent with an illustrative embodiment. The use of the solder hierarchy as disclosed can prevent undesired solder reflows. A substrate laminate 605, a bridge 610, and a semiconductor chip 619 are shown. Pads 615 are arranged on the substrate laminate 605. In this example, the bridge 610 is first attached to the chip 619, followed by attachment of the bridge 610 and the chip 619 to the laminate 605.

In one embodiment, for the semiconductor chip 619, C4 is used for a 150 um pitch between a top center of the bumps. Higher temperature solder (e.g. Sn 1.8% Ag solder) may be used for a 226C reflow. The pads in the bridge region may be a composite of Ni and Au. With regard to the bridge 610, a plate solder of tin (Sn) has a 232C reflow (a lower reflow temperature than the Sn 1.8% Ag solder used for the semiconductor chip 619). In this embodiment, the pillars are arranged at a 30 um pitch (as measured from a top center of one pillar to a top center of an adjacent pillar). The pillars may have, for example, a 20 um diameter total formed of 15 um of Sn, 3 um Cu and 2 um of Ni. Alternatively, in a case where the pillar has a 75 um pitch and a 40 um diameter. The 40 um diameter can be, for example, formed of 13 um of Cu, 2 um of Ni and 25 um of Sn.

With continued reference to FIG. 6, the laminate 605 has a top side solder constructed of SN 3.0% Ag 0.5% Cu with a 220C reflow. The 220C reflow temperature used for the laminate 605 is lower than then 232C reflow temperature of the bridge 610 and the 226C reflow temperature of the semiconductor chip 619. Thus, the bridge 610 and chip 619 is assembled first and then attached to the laminate which has a lower 220C reflow temperature. This construction reduces or prevents defects from unintended solder reflows.

It should be noted that the size of the pitch between a top center of the pillars may range from, for example 5-100 um. The size of the pitch between a top center of the bumps may range from, for example, 100-200 um. In various embodiments, the diameter of the bumps may range from 40-60% of the pitch.

Conclusion

The descriptions of the various embodiments of the present teachings have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

While the foregoing has described what are considered to be the best state and/or other examples, it is understood that various modifications may be made therein and that the subject matter disclosed herein may be implemented in various forms and examples, and that the teachings may be applied in numerous applications, only some of which have been described herein. It is intended by the following claims to claim any and all applications, modifications and variations that fall within the true scope of the present teachings.

The components, steps, features, objects, benefits and advantages that have been discussed herein are merely illustrative. None of them, nor the discussions relating to them, are intended to limit the scope of protection. While various advantages have been discussed herein, it will be understood that not all embodiments necessarily include all advantages. Unless otherwise stated, all measurements, values, ratings, positions, magnitudes, sizes, and other specifications that are set forth in this specification, including in the claims that follow, are approximate, not exact. They are intended to have a reasonable range that is consistent with the functions to which they relate and with what is customary in the art to which they pertain.

Numerous other embodiments are also contemplated. These include embodiments that have fewer, additional, and/or different components, steps, features, objects, benefits and advantages. These also include embodiments in which the components and/or steps are arranged and/or ordered differently.

The flowchart, and diagrams in the figures herein illustrate the architecture, functionality, and operation of possible implementations according to various embodiments of the present disclosure.

While the foregoing has been described in conjunction with exemplary embodiments, it is understood that the term "exemplary" is merely meant as an example, rather than the best or optimal. Except as stated immediately above, nothing that has been stated or illustrated is intended or should be interpreted to cause a dedication of any component, step, feature, object, benefit, advantage, or equivalent to the public, regardless of whether it is or is not recited in the claims.

It will be understood that the terms and expressions used herein have the ordinary meaning as is accorded to such terms and expressions with respect to their corresponding respective areas of inquiry and study except where specific meanings have otherwise been set forth herein. Relational terms such as first and second and the like may be used solely to distinguish one entity or action from another without necessarily requiring or implying any actual such relationship or order between such entities or actions. The terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element proceeded by "a" or "an" does not, without further constraints, preclude the existence of additional identical elements in the process, method, article, or apparatus that comprises the element.

The method as described above may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip may be mounted in a single chip package (such as a plastic carrier, with leads that are affixed to a motherboard or other higher-level carrier) or in a multichip package (such as a ceramic carrier that has either or both surface interconnections or buried interconnections). In any case, the chip can then be integrated with other chips, discrete circuit elements, and/or other signal processing devices as part of either (a) an intermediate product, such as a motherboard, or (b) an end product. The end product can be any product that includes integrated circuit chips, ranging from low-end applications, such as toys, to advanced computer products having a display, a keyboard or other input device, and a central processor.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments have more features than are expressly recited in each claim. Rather, as the following claims reflect, the inventive subject matter lies in less than all features of a single disclosed embodiment. Thus, the following claims are hereby incorporated into the Detailed Description, with each claim standing on its own as a separately claimed subject matter.

What is claimed is:

1. An electronic package, comprising:
a substrate having an upper surface with a trench formed in a bridge region;
a plurality of first pads arranged on the upper surface of the substrate, outside of the bridge region;
a bridge positioned in the trench;
a plurality of second pads arranged on an upper surface of the bridge;
a plurality of pillars, each of the pillars having a first end and a second end, the first end being electrically coupled to one of the plurality of second pads; and
two or more semiconductor chips in a side-by-side proximal arrangement overlaying the bridge and the substrate, wherein:
the upper surface of the bridge need not be aligned with the upper surface of the substrate;
each of the two or more semiconductor chips have a plurality of first electrical connections including bumps,
each of the bumps is configured to correspond to and electrically couple with one pad of the plurality of first pads outside of the bridge region,
each of the two or more semiconductor chips includes a plurality of second electrical connections including third pads, and
each one of the third pads is configured to correspond to and electrically couple with the second end of one of the plurality of pillars.

2. The electronic package of claim 1, wherein the electronic package is a direct bonded heterogeneous integration (DBHi) structure.

3. The electronic package of claim 2, wherein each of the bumps on the two or more semiconductor chips comprise an under bump metallurgy (UBM) having one or more of a mixed pitch or size.

4. The electronic package of claim 3, wherein each of the bumps on the two or more semiconductor chips have a different size than the pillars on the bridge.

5. The electronic package of claim 1, wherein the bumps comprise a controlled collapse chip connection (C4).

6. The electronic package of claim 1, further comprising a lid and a thermal interface material overlaying the two or more semiconductor chips.

7. The electronic package of claim 1, further comprising an underfill material between the two or more semiconductor chips and the substrate.

8. The electronic package of claim 1, wherein the bridge comprises a semiconductor chip.

9. The electronic package of claim 1, wherein:
the bridge comprises a memory chip, and
the at least two semiconductor chips overlaying the substrate comprise a microprocessor chip and a power supply chip, respectively.

10. The electronic package of claim 1, further comprising I/O pads electrically coupled to a lower surface of the substrate.

11. A method of forming an electronic package, comprising:
positioning a bridge in a trench of a substrate to form a bridge region;
attaching a plurality of first pads to an upper surface of the substrate outside of the bridge region;
attaching a plurality of second pads to an upper surface of the bridge;
forming a plurality of pillars, each of the pillars having a first end electrically coupled to one of the plurality of second pads on the bridge;
positioning two or more semiconductor chips in a side-by-side proximal arrangement overlaying the bridge and the substrate, each of the two or more semiconductor chips including first electrical connections that are coupled to at least some of the plurality of pillars on the bridge in the bridge region, and second electrical connections that are coupled to the plurality of first pads on the substrate outside of the bridge region.

12. The method of claim 11, further comprising, prior to positioning the bridge in the trench of the substrate, electrically coupling the two or more semiconductor chips to the bridge.

13. The method of claim 12, wherein:
the coupling of the two or more semiconductor chips to the bridge is performed sequentially;
the first electrical connections of the two or more semiconductor chips include bumps,
each of the bumps are electrically coupled to one of the plurality of first pads outside of the bridge region,
the second electrical connections of the two or more semiconductor chips include third pads, and
each of the third pads is configured to correspond to and electrically couple with a respective second end of one of the plurality of pillars in the bridge region.

14. The method according to claim 13, wherein each of the bumps on the two or more semiconductor chips comprise an under bump metallurgy (UBM) having one or more of a mixed pitch or size.

15. The method of claim 13, wherein the electronic package comprises a direct bonded heterogeneous integration (DBHi) structure.

16. The method of claim 14, wherein the bumps on the two or more semiconductor chips are a different size or have a different pitch than the pillars on the bridge.

17. The method of claim 11, wherein the bumps comprise a controlled collapse chip connection (C4).

18. The method of claim 11, further comprising arranging a lid on the upper surface of the substrate and arranging a thermal interface material (TIM) between at least the two or more semiconductor chips and the lid, and arranging an underfill material between the two or more semiconductor chips and the substrate.

19. The method of claim 11, wherein the bridge comprises a memory chip, and the at least two semiconductor chips overlaying the substrate comprise a microprocessor chip and a power supply chip, respectively.

20. An assembly process sequence for an electronic package according to a solder hierarchy, the process comprising:

determining a solder reflow temperature for a plurality of components including a laminate substrate, a bridge and a semiconductor chip;

upon determining a first highest solder reflow temperature and a second highest reflow temperature of the components, attaching a first component comprising the bridge having the first highest solder reflow temperature to a second component comprising the semiconductor chip having the second highest solder reflow temperature; and attaching the first component and the second component to a third component comprising the laminate substrate having the lowest solder reflow temperature by arranging the bridge in a trench formed in an upper surface of the laminate substrate.

* * * * *